United States Patent [19]

Tamaki et al.

[11] Patent Number: 5,227,001
[45] Date of Patent: Jul. 13, 1993

[54] INTEGRATED DRY-WET SEMICONDUCTOR LAYER REMOVAL APPARATUS AND METHOD

[75] Inventors: Takio Tamaki, Urawa, Japan; Sanjeev R. Chitre, San Jose, Calif.

[73] Assignee: Integrated Process Equipment Corporation, San Jose, Calif.

[21] Appl. No.: 599,804

[22] Filed: Oct. 19, 1990

[51] Int. Cl.⁵ ........................................... H01L 21/00
[52] U.S. Cl. ............................... 156/345; 156/643; 156/659.1; 156/651; 156/637; 156/626
[58] Field of Search ............ 156/345, 643, 659.1, 156/651, 633, 637, 638, 626; 118/723, 715

[56] References Cited

U.S. PATENT DOCUMENTS

| | | | |
|---|---|---|---|
| 3,775,202 | 11/1973 | Meek et al. | 156/345 |
| 4,087,370 | 5/1978 | Singalewitch et al. | 134/3 |
| 4,482,424 | 11/1984 | Katzir et al. | 156/643 |
| 4,687,542 | 8/1987 | Davis et al. | 156/345 |
| 4,980,022 | 12/1990 | Fujimura et al. | 156/345 |
| 5,007,981 | 4/1991 | Kawasaki et al. | 156/643 |
| 5,037,506 | 8/1991 | Gupta et al. | 156/659.1 |

FOREIGN PATENT DOCUMENTS

| | | |
|---|---|---|
| 55-72040 | 5/1980 | Japan . |
| 59-87819 | 5/1984 | Japan . |
| 63-184337 | 7/1988 | Japan . |
| 1-138721 | 5/1989 | Japan . |
| 165461 | 6/1990 | Japan . |

OTHER PUBLICATIONS

Durney, Ed.; "Electroplating Engineering Handbook"; Van Nostrand Reinhold Co.; ©1984; New York, N.Y.; pp. 691-709.

Primary Examiner—Brian E. Hearn
Assistant Examiner—George Goudreau
Attorney, Agent, or Firm—Spensley Horn Jubas & Lubitz

[57] ABSTRACT

A system and process for removing a layer of a defined composition from a semiconductor wafer by performing at least one dry layer removal operation and at least one wet removal operation. A dry removal unit and a wet removal unit are disposed adjacent one another and robot mechanisms are provided to automatically transfer one wafer at a time through each unit in turn. The robot mechanisms are constructed to contact each wafer substantially at its edge in order to assure uniform treatment of both major surfaces of the wafer.

For stripping a resist layer from a wafer, the dry stripping operation can be performed first to remove a portion of the layer, after which the remainder of the layer is removed by the wet stripping operation. At the end of the wet stripping operation, the wafer is rinsed in water and used rinse water is monitored to determine at least one of its resistivity and total organic content in order to produce an indication that removal of undesired materials from the wafer surfaces has been completed. Subsequent to the wet treatment, the wafer is subjected to a cleaning with an aqueous mist on which ultrasonic vibrations are imposed.

19 Claims, 6 Drawing Sheets

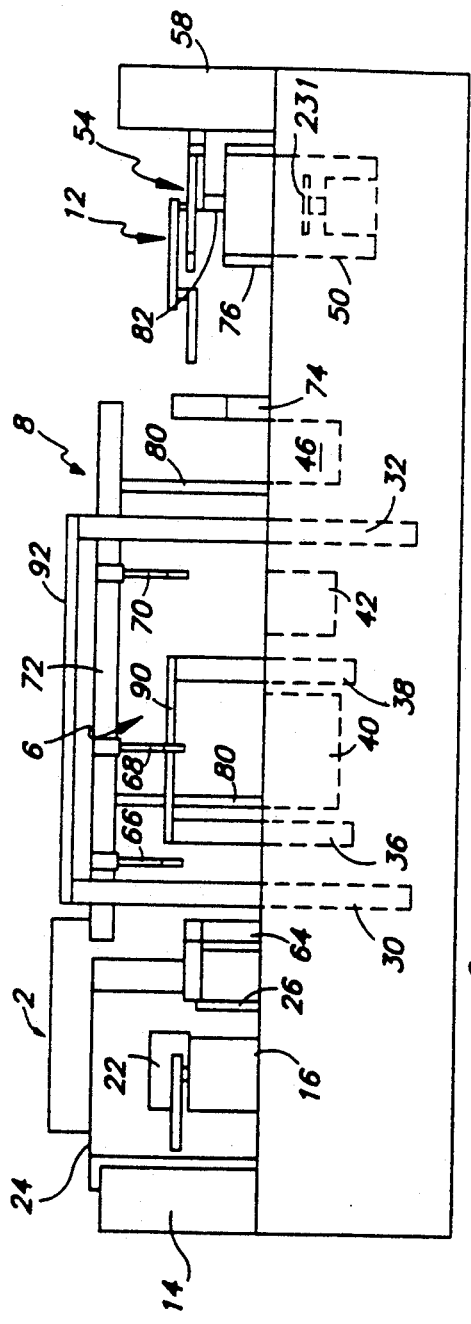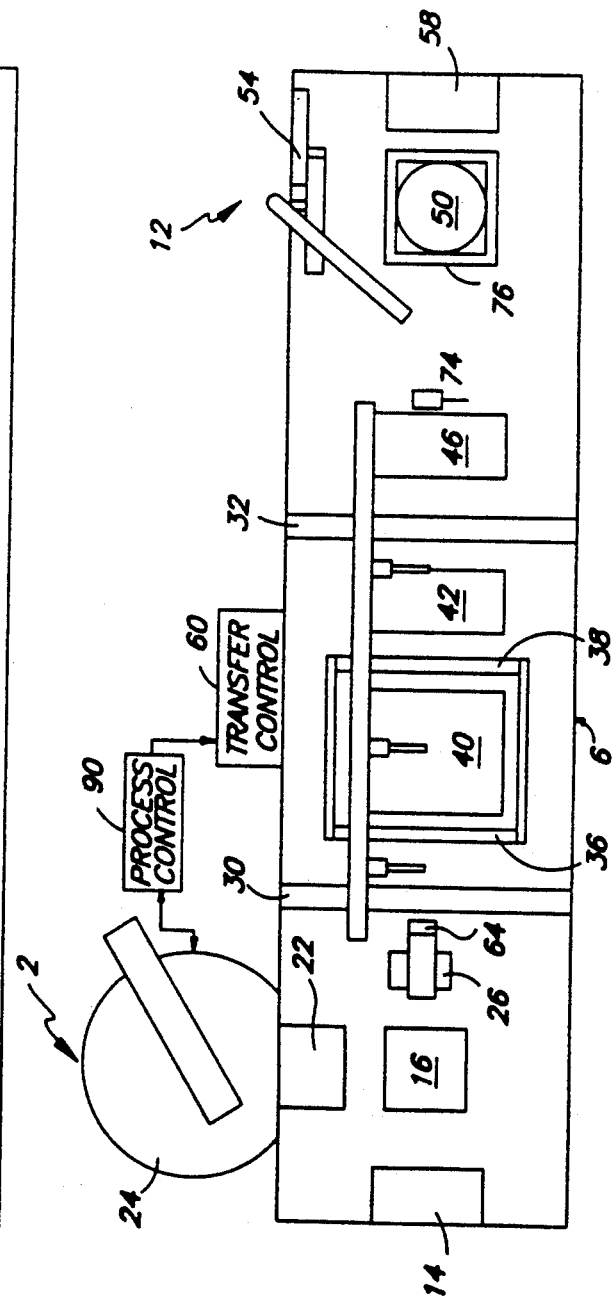

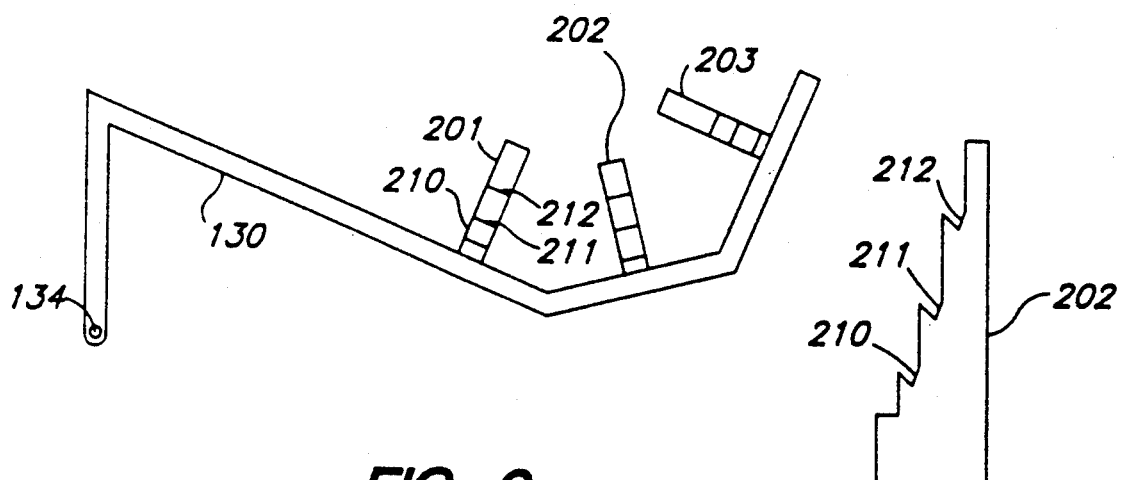
FIG. 6
FIG. 7
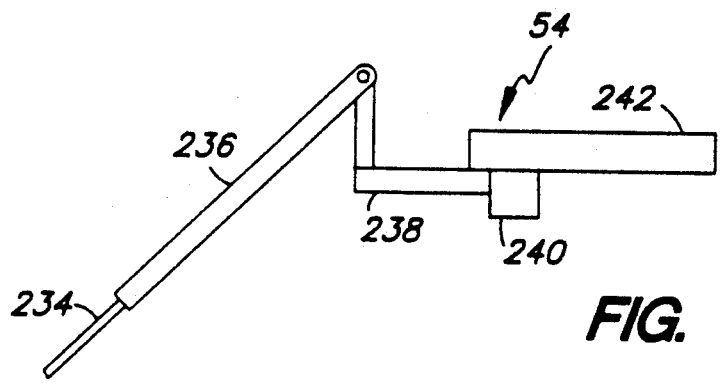
FIG. 14
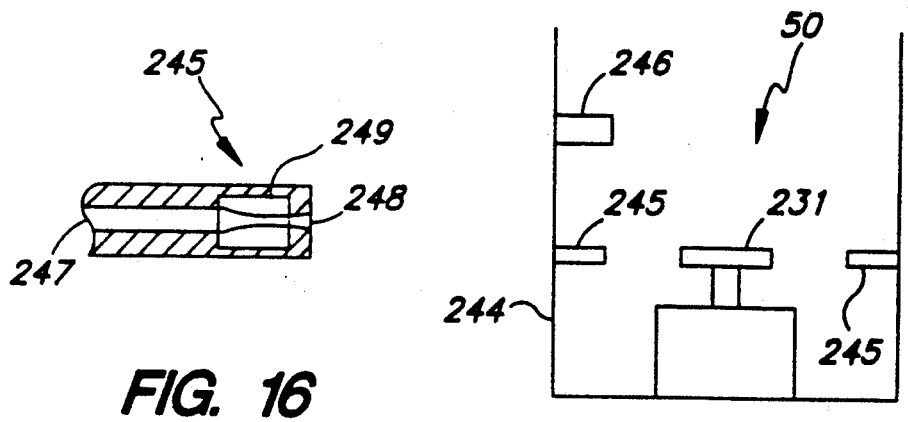
FIG. 16
FIG. 15

INTEGRATED DRY-WET SEMICONDUCTOR LAYER REMOVAL APPARATUS AND METHOD

BACKGROUND OF THE INVENTION

The present invention relates to the removal of a layer of material from semiconductor integrated circuit wafers during the course of circuit fabrication, and relates particularly to stripping of resist coatings.

The manufacture of semiconductor integrated circuits requires a substantial number of process steps including, typically, photoresist stripping carried out at several stages in the fabrication process. Known techniques for stripping such a coating include a dry stripping process in which a gas plasma is brought into contact with the coating and a wet stripping process in which a chemical solution is brought into contact with the coating to effect dissolution of the coating material. These stripping processes are typically associated with subsequent rinsing, cleaning and drying operations. A photoresist stripping procedure may involve all of these individual process steps.

The yield of a complete semiconductor wafer fabrication procedure depends to a large extent on the total number of steps involved since each individual step will produce at least a limited number of rejects. To the extent that individual processes can be integrated into, essentially, a single operation, the total yield of such a fabrication procedure can be improved.

To date, the complete removal of a photoresist coating has required a not insignificant number of individual steps, and since different photoresist coatings must be stripped a number of times from a wafer during a complete fabrication procedure, this operation constitutes a significant source of rejects.

Photoresist stripping operations are complicated by the fact that they must be performed on photoresist coatings having a variety of forms. Thus, during a complete fabrication procedure, it may be necessary to strip heavily implanted photoresist coatings, photoresist coatings which received deep ultraviolet exposures, normal positive and negative photoresists, fluorinated photoresists and plasma hardened photoresists.

According to the practices currently employed in the art, stripping parameters, i.e. process times, chemicals used, etc., are set manually for each type of resist layer to be stripped. Therefore, considerable time is taken for changing these parameters for each different resist layer type.

SUMMARY OF THE INVENTION

It is a primary object of the present invention to increase the overall yield, and reduce the cost, of a semiconductor integrated circuit fabrication procedure.

A more specific object of the invention is to reduce the number of rejects created by photoresist coating stripping operations.

Another specific object of the invention is to reduce the number of individual process steps required to effect such stripping.

Another specific object of the invention is to automate such a stripping operation in a manner which allows complete and reliable stripping of a variety of types of photoresists.

A further object of the invention is to automatically adjust to different resist layers.

Yet another object of the invention is to improve the cleaning of a semiconductor wafer at the conclusion of such a stripping operation.

A still further object of the invention is to prevent resist material from diffusing into the wafer surface during a stripping operation.

The above and other objects are achieved, according to the present invention, by a system for removing a discrete layer of a defined material from each of a plurality of semiconductor wafers, comprising:

a) a first removal unit having an entrance region and an exit region, the first removal unit being composed of:
 i) a first material removal device for receiving one wafer at a time and removing at least part of the discrete layer from the wafer by a dry process;

b) a second removal unit having an entrance region and an exit region, the second removal unit including a second material removal device composed of:
 i) at least one material removal tank;
 ii) first supply means for maintaining a bath of a liquid solution of a chemical for removing the defined material from each wafer.
 iii) at least one rinsing tank;
 iv) second supply means for maintaining a bath of a liquid rinsing solution in the rinsing tank;
 v) wafer cleaning means for removing contaminants from a wafer; and
 vi) wafer drying means for removing substantially all moisture from a wafer; and c) automated transfer means for transferring one wafer at a time, in the recited order:
 from the entrance region, through the material removal device and to the exit region of one of the first and second removal units; and from the entrance region, through the material removal device and to the exit region of the other one of the first and second removal units, the automated transfer means further comprising means associated with the second removal unit for transferring one wafer at a time from the entrance region of the second removal unit and then, in the recited order: into the material removal tank; into the rinsing tank; into the wafer drying means; and to the exit region of the second removal unit;

d) wherein the units are arranged so that the exit region of the one of the units is disposed adjacent the entrance region of the other one of the units.

BRIEF DESCRIPTION OF THE DRAWINGS

FIG. 1 is a side elevational view, and FIG. 2 a top plan view, of one preferred embodiment of an integrated stripping installation according to the present invention. These are simplified diagrammatic views provided to facilitate an understanding of the general arrangement of the basic components in such an installation.

FIG. 6 is a view similar to that of FIG. 5 of a second embodiment of the device of FIG. 5.

FIG. 7 is a side elevational detail view of a component of the device of FIG. 6.

FIG. 14 is a plan view of a wafer handling mechanism employed in the system of FIGS. 1 and 2.

FIG. 15 is a pictorial side view of one unit of the system shown in FIGS. 1 and 2.

FIG. 16 is a cross-sectional detail view of a component employed in the unit of FIG. 15.

DESCRIPTION OF THE PREFERRED EMBODIMENTS

Figure 3:
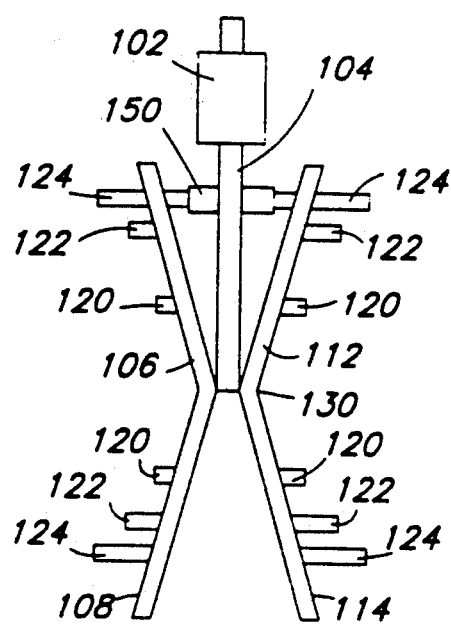
FIGS. 3 and 4 are two elevational views of one wafer transfer device employed in the system of FIG. 1.

The installation illustrated in FIGS. 1 and 2 is composed generally of a wafer receiving and dry stripping station 2, a wet stripping station 6, a rinsing station 8, and a final cleaning, drying and wafer delivery station 12.

Station 2 has an inlet end, or region, provided with a unit 14 for receiving a cassette containing a plurality of wafers and a wafer pick-up device 16 which removes each wafer individually from cassette 14, and transfers the wafer to a loading device 22 of a dry stripper unit 24. Each wafer is introduced into dry stripper unit 24 individually and after completion of the dry stripping operation, the wafer is transferred out of unit 24, again taken by device 16 and transferred to the outlet end, or region, of station 2 where the wafer is transferred to an alignment device 26.

Wet stripping station 6 is bounded, at its inlet region, by a pre-door 30 and, at its exit region, by a post door 32.

Wet stripping station 6 further includes a main entrance door 36, a main exit door 38, a wet stripping bath tank unit 40 and a first rinsing tank 42, known as a spray and dump tank. Tank unit 40 may contain two or more stripping tanks.

Downstream of post door 38, in station 8, there is provided a rinsing tank 46 containing an ultrasonic vibrator (not shown).

Station 12 includes a cleaning and spin dry unit 50, a transfer mechanism 54 for transferring each wafer to unit 50, and a unit 58 for receiving a cassette, into which each wafer is transferred, after which the cassette is then removed from the installation. Transfer mechanism 54 is operative for delivering each wafer to unit 58.

Transfer of each wafer in sequence from a cassette in unit 14 to a cassette in unit 58 is effected by a series of robot mechanisms which are preferably program-controlled by a transfer control 60. These mechanisms include pick-up device 16 and alignment device 26. The latter device is provided to rotate each wafer until the wafer flat has a given angular position. Typical wafers are essentially circular discs having a central axis and provided at one portion of their periphery with a flattened region, or flat, which is used to orient the wafer about its axis during successive fabrication operations. In the installation shown in FIGS. 1 and 2, each wafer is aligned in device 26 to facilitate handling by subsequent robot mechanisms.

During passage of each wafer through station 2, the wafer has a horizontal orientation, i.e. its major faces are horizontal. However, it is desired to give each wafer a vertical orientation for the wet stripping and rinsing operations. For this purpose, an orientation mechanism 64 is disposed to pivot about a horizontal axis so as to withdraw each wafer from device 26 and bring the wafer to a vertical orientation at a location adjacent, or within, the doorway of door 30 when the latter is open.

Transport of each wafer through wet stripping station 6 and rinsing station 8 is effected by three robot units 66, 68, and 70 supported by, and moveable along, a track 72. Each robot unit includes a vertically extending arm and electrically controllable drive means for moving the unit horizontally along track 72 and for moving the associated arm vertically.

Further robot arms (not shown in FIGS. 1 and 2) perform the task of immersing each wafer in each chemical bath and each rinsing bath.

At the exit region of rinsing station 8, each wafer is transferred to a second orientation mechanism 74, which is essentially identical to mechanism 64, for pivoting each wafer back to a horizontal orientation. Then, each wafer is taken up by transfer mechanism 54 for transfer to unit 50 and then to a second alignment device 76 and finally to a cassette in unit 58. After the cassette in unit 58 has filled, it is removed manually and transported to the next processing station.

Track 72 is supported by posts 80 and mechanism 54 is supported by one or more posts 82.

Each of doors 30, 32, 36 and 38 is vertically moveable between a raised position, in which the associated doorway is closed, and a lowered position, in which the associated doorway is open. Doors 30 and 32 are constructed to fit around track 72 when the doors are closed.

Station 6 is completed by a first hood 90 enclosing tank unit 40 on all sides except those covered by doors 36 and 38 and a second hood 92 enclosing hood 90, track 72 and tank 42 on all sides except those covered by doors 30 and 32. Hood 90 has a longitudinal slot for passage of the vertical arms of units 66, 68 and 70. Doors 30, 32, 36 and 38 are normally opened only when needed to permit transport of a wafer and are preferably controlled so that either both doors 30 and 32 or both doors 36 and 38 are closed at any given time to minimize escape of vapors from the stripping baths. An exhaust system (not shown) is connected to continuously exhaust vapors from the region enclosed by hood 92.

Dry stripper unit 24 may be constructed in accordance with principles already well known in the art and may be constituted by a known, commercially available dry stripper, such as a device marketed by the GaSasonics division of Atomel Corporation of Sunnyvale, Calif., under the trade name AURA. Embodiments of units 14, 16 and 22 are already known in the art for use with such a dry stripping device. Device 24 may be equipped with a process control 90, of a type known per se, to monitor the oxygen content of gas conducted past a wafer during dry stripping. The purpose of control 90 will be described below.

Each successive wafer is transferred between the exit end of station 2 and the tanks of unit 40 by robot unit 66, between the last tank of unit 40 and tank 42 by robot unit 68 and between tanks 42 and 46 and mechanism 74 by robot unit 70. This arrangement can be varied in that robot unit 68 can also transfer wafers from the first tank of unit 40, other variations of this nature also being possible. Mechanism 74 pivots the wafer back into a horizontal orientation and delivers the wafer to mechanism 54. Mechanism 54 transfers each wafer between unit 50, device 76 and unit 58.

In an installation according to the present invention, the robot units which convey wafers along the length of the installation do not contact the various wet stripping baths and each wafer is lowered into an associated bath by a robot arm which is associated only with that bath. Furthermore, as will be described in detail below, each robot unit is operated to avoid transferring any chemicals from one bath to another.

Figure 4:
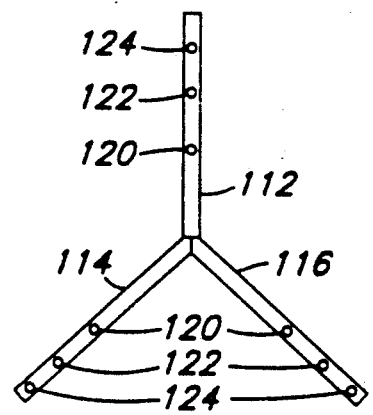

A suitable embodiment of robot units 66, 68 and 70 is illustrated in FIGS. 3 and 4 which are, respectively, a side elevational view and a front elevational view. The illustrated robot unit includes a support member 102 which is mounted to be displaced along the associated longitudinal track 72 (not shown) and which carries a support rod 104 that may be constructed to be vertically moveable in carrier 102. Rod 104 carries two sets of arm members, each set being composed of three arm members. FIG. 3 shows two arm members 106 and 108 of the first set and two arm members 112 and 114 of the second set, while FIG. 4 shows the three arm members 112, 114 and 116 of the second set. Each arm member carries three wafer engaging pins 120, 122 and 124. All pins 120 are equidistant from the midpoint of the three associated arm members of each set, as are all pins 122 and all pins 124.

In the longitudinal direction illustrated in FIG. 3, all of the arms 106, 108, 112, 114 and 116 are inclined to the vertical and pins 120, 122 and 124 are given respectively different lengths such that pins closest to center 130 are the shortest and pins 124 most remote from the center 130 are the longest. As will become more readily apparent from the description presented below, this arrangement is provided to enable any one set of three pins, i.e. pins 120, or pins 122, or pins 124, to cooperate with an associated tank robot arm.

Referring to FIG. 4, pins 120, 122 and 124 are positioned so that each group of three pins can engage, and carry, a wafer having a respective diameter while contacting only the edges of the wafer, to thereby avoid contaminating the wafer surface. Currently, semiconductor integrated circuits are fabricated on wafers having diameters of 5", 6" and 8".

Arm members 106, 108, 112, 114 and 116 may be made of steel blades coated with PTFE and pins 120, 122 and 124 may be made of PTFE.

Figure 5:
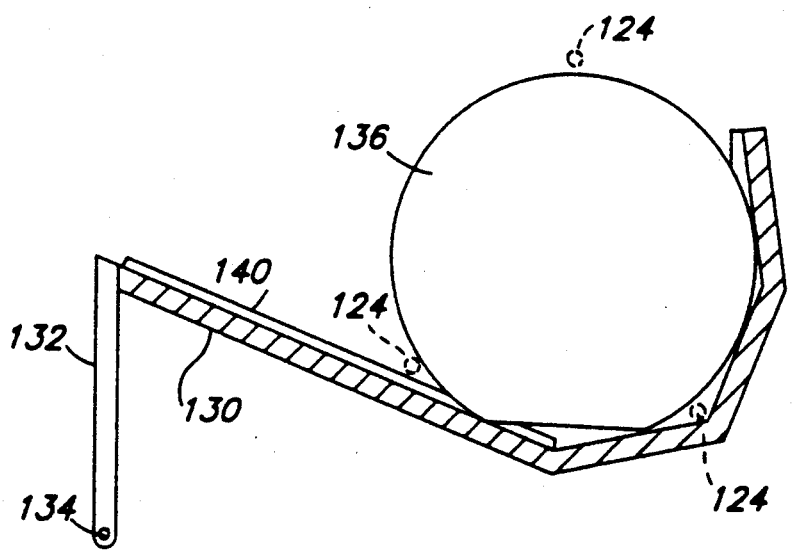
FIG. 5 is a side elevational view of a first embodiment of a further wafer transfer device employed in the installation of FIGS. 1 and 2.

Each tank robot arm may have the form illustrated in FIG. 5 and is composed of an arm 130 having approximately a J-shape and supported at its end corresponding to the stem of a "J" by a pivot arm 132 supported at a fixed pivot point 134 for pivotal movement between a raised position, as illustrated, and a lowered position in which a wafer 136 carried by arm 130 is immersed in a chemical or rinsing bath. Arm 130 is provided with a longitudinal groove 140 for retaining wafer 136 via its edges without contacting the main faces of wafer 136. Also shown in FIG. 5 is the location of three pins 124 at the time wafer 136 is being transferred between arm 130 and the robot arm depicted in FIGS. 3 and 4.

To facilitate an understanding of the manner in which a robot unit 66, 68, 69 or 70 cooperates with tank robot arms, the operation of the devices shown in FIGS. 3, 4 and 5 will be described with reference to robot unit 68 and robot arms associated with two tanks of tank unit 40 and tank 42.

As a wafer is carried through the installation shown in FIGS. 1 and 2, it becomes progressively cleaner and it is desired that solution in one tank not be transferred to the next tank downstream. It is further desired that, after leaving a given tank, a wafer not be contacted by robot unit pins which contacted it before it entered that tank, when the wafer had a higher level of contamination.

To achieve this, transfer from the upstream tank to the downstream tank of unit 40 is achieved while the wafer is held by pins carried by the three arms including arms 106 and 108, while transfer from the downstream tank of unit 40 to tank 42 is achieved while the wafer is held by pins carried by arms 112, 114 and 116. Therefore, any contamination present on a wafer before it enters the downstream tank will not be transferred to the fingers carried by arms 112, 114 and 116.

After processing of a wafer in the upstream tank of unit 40, the associated tank robot arm is pivoted upwardly to bring the wafer out of the bath. Robot unit 68 is then positioned to the right of that tank robot arm, rod 104 is moved to the correct height, if needed, and carrier 102 is moved to the left to cause the wafer to be engaged by, for example, pins 124. These pins may be given a slight degree of flexibility to permit them to suitably grip the wafer. Rod 104 is then raised, if necessary, and carrier 102 is displaced to the right to a position at which it is located just to the right of the robot arm of the downstream tank of unit 40. Rod 104 is then moved downwardly, if necessary, and carrier 102 is moved to the left to bring the wafer in line with groove 140 in the associated tank robot arm. Rod 104 is then moved downwardly a small distance and carrier 102 is moved to the right to disengage fingers 124 from the wafer. The tank robot arm is then lowered to immerse the wafer in the associated bath for the time needed to carry out the desired stripping operation.

Transfer of a wafer from a robot unit 66, 68, of 70 to another robot member can be facilitated by associating each of arms 106 and 112 (FIG. 3) with a solenoid and armature device 150 that can be electrically actuated by the tranfer control 60 to move arm 106 or 112 by a small distance toward rod 104 to thereby release the grip by the pins on the wafer.

Then, carrier 102 is brought to a position to the left of the robot arm of the downstream tank of unit 40 and that arm is raised, after which rod 104 is moved vertically, if necessary, and carrier 102 is moved to the right to cause pins 124 on arms 112, 114 and 116 to engage the wafer. Rod 104 may then be moved upwardly and carrier 102 moved to the right to bring wafer in position to the left of the robot arm of tank 42, which is then in its raised position. Rod 104 then moves downwardly to cause the wafer to engage in the recess 140 of that tank robot arm, after which carrier 102 is moved to the left so that the pins 124 on arms 112, 114 and 116 disengage from the wafer. Carrier 102 may then move back to the left to the location for withdrawing the next wafer from the tank robot arm of the upstream tank of unit 40.

For certain modes of operation, it will be desirable to use robot unit 66 to transport wafers between mechanism 64 and both tanks of unit 40. This will be achieved in the same manner as described above with reference to robot unit 68. In this case, unit 66 can be transporting a wafer between the tanks of unit 40 while unit 68 is transferring a wafer from the downstream tank of unit 40.

A second embodiment of a device for moving each wafer into and out of a chemical bath or a rinse bath is illustrated in FIGS. 6 and 7. As shown in FIG. 6, groove 140 of FIG. 5 is replaced by three support arms 201, 202 and 203 each having, particularly as shown in FIG. 7 with respect to arm 202, three support ledges 210, 211 and 212. Corresponding ledges on each arm 201 and 203 are positioned for supporting a wafer having a respective diameter. Arms 201, 202 and 203 are angularly spaced from one another to cradle a wafer in a secure manner throughout the range of pivotal movement of arm 130. This means that arm 203 will always be disposed to one side of the center of gravity of the wafer and arm 201 will always be disposed to the other side thereof. When the arrangement shown in FIGS. 6 and 7 is employed, the wafer flat will normally engage an appropriate ledge on arm 202.

Figure 8:
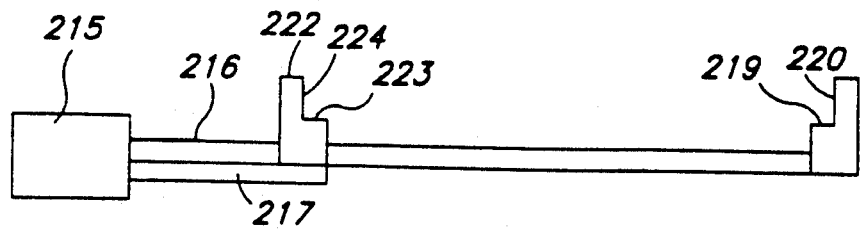
FIGS. 8-13 are plan views and elevational views, respectively, of three other wafer handling devices employed in the system of FIGS. 1 and 2.
Figure 9:
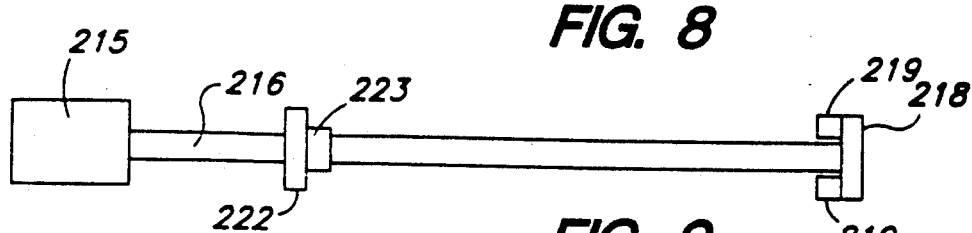

FIGS. 8 and 9 illustrate, in a side elevational view and a top plan view, one embodiment of a robot arm carried by unit 16 to transfer successive wafers through station 2. This structure includes a support member 215 which is mounted to undergo pivotal movement about a vertical axis and carries longitudinally extendable rods 216 and 217. Rod 216 carries, at its free end, a wafer holding member 218 having two wafer support surfaces 219 and a wafer edge engaging surface 220. Rod 217 carries a second wafer holding member 222 having a wafer bottom support surface 223 and a wafer edge engaging surface 224. Surfaces 219 and 223 contact only a small portion of the bottom surface of a wafer.

In operation, the entire assembly is rotated to face cassette receiving unit 14 and both rods 216 and 217 are extended as a unit to enter into device 14. The cassette in device 14 can then be moved vertically to bring a wafer into position between members 220 and 222. Then rods 216 and 217 are moved relative to one another to firmly grip the wafer. Thereafter, arms 216 and 217 are withdrawn as a unit from device 14, control member 215 is rotated and the movement of rods 216 and 217 is reversed to deposit the wafer at loading device 22. After the dry stripping operation has been performed, the wafer is again taken up by device 16 and control member 215 is pivoted to bring the wafer into a position where it can be transferred to alignment device 26 and mechanism 64. If desired, the mechanism shown in FIGS. 8 and 9 can be inverted realtive to the illustrated orientaion.

Figure 10:
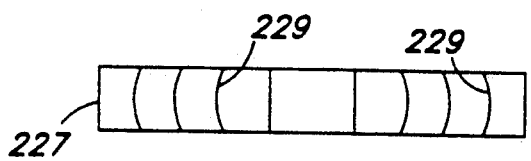
Figure 11:
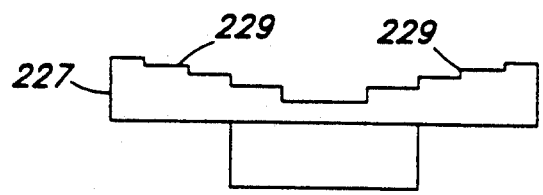

Mechanism 64 includes a wafer holding fixture which may have the general form shown in plan view in FIG. 10 and side elevational view in FIG. 11. This fixture is composed of a wafer holding body 227 provided with a plurality of sets of wafer edge engaging surfaces 229, one set of surfaces being provided for each wafer diameter. The spacing between two associated surfaces 229 is selected to enable a wafer to be lightly gripped between those surfaces. A wafer is deposited between the appropriate surfaces by device 16, after which members 220 and 222 (FIGS. 8 an 9) are moved apart from one another and either control member 215 is lowered slightly or body 227 is raised slightly to permit withdrawal of the wafer holding elements of device 16.

The wafer is then engaged by aligning device 26 to rotate the wafer about its vertical center axis until the wafer flat has the desired angular position.

Then, device 64 can be pivoted upwardly to bring the wafer into the doorway existing when door 30 is open and robot unit 66 can be moved to the left to cause a set of pins on the left-hand arms 106, 108 (FIG. 3) to engage the wafer for withdrawal from body 227.

Figure 13:
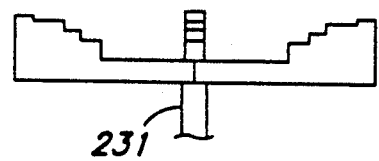
Figure 12:
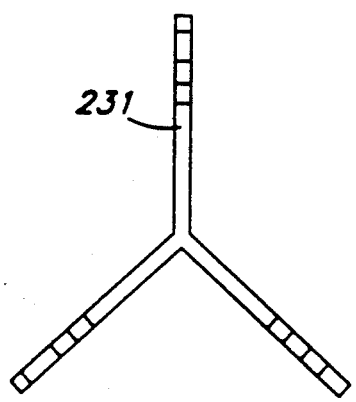

At the exit region of station 8, each wafer is transferred to device 74, which may be identical to device 64 and which pivots the wafer back into a horizontal orientation. The wafer may then be transferred to mechanism 54, which can have a wafer gripping assembly similar to that shown in FIGS. 8 and 9 and which may be inverted relative to the illustrated orientaion. When the wafer is then brought to unit 50, it may be deposited on a wafer support device having the form shown in plan view in FIG. 12 and in side elevational view in FIG. 13. This wafer holding device is constituted by a body 231 having three arms each provided with holding receptacles for wafers of different diameters. The body is supported by a post 232 via which body 231 can be both spun and raised and lowered. After a wafer is deposited on body 231, the latter is lowered into unit 50 where it is subjected to cleaning and spin drying, as will be described in greater detail below. At the completion of these operations, body 231 is raised and the wafer is acted on by alignment unit 76 to bring the wafer flat to the desired angular position prior to introduction of the wafer into cassette receiving unit 58.

Transfer mechanism 54 will now be described in greater detail with reference to FIG. 14, which is a plan view. A member 234 for gripping a wafer is carried by a pivot arm 236 which is, in turn, pivotally mounted to a carrier member 238. Carrier member 238 is supported by a drive unit 240 which can be displaced longitudinally along a track 242. Wafer gripping device 234 can be extended from and retracted into arm 236 by suitable electrically driven control devices. Thus, wafer gripping device can be moved along a desired path by a combination of extension and retraction movements relative to arm 236, pivoting of arm 236 about carrier 238, under control of a suitable motor, and longitudinal displacement of unit 240 along track 242.

Referring now to FIG. 15, which is a simplified pictorial view, unit 50 will be further described.

When a wafer is deposited on body 231, the body is lowered into a tank 244 where the wafer carried by body 231 is subjected to a cleaning with a water mist emitted by nozzles 245. According to the invention, nozzles 245 transmit ultrasonic vibrations to the mist, resulting in a forceful cleaning of the wafer. Because the cleaning fluid is in the form of a mist, it can act uniformly on both the upper and lower surfaces of the wafer. This cleaning operation is capable of removing contamination and submicron particles from the wafer surfaces. During this cleaning operation, body 231 is rotated at a relatively low speed, for example of the order of 100–200 rpm.

Thereafter, body 231 may be raised, or may remain in its lowered position, and the wafer is subjected to spin drying at a higher speed of the order of 2–10 thousand rpm while being sprayed, as by means of one or more nozzles 246, with deionized water to increase the conductivity of the medium contacting the wafer and thus reduce electrostatic discharge from the wafer. At this time, ionized nitrogen may be introduced into the medium to further increase its conductivity, and aid in the prevention of electrostatic discharges. Alternatively, solvents such as isopropyl alcohol may be used in this stage. At the end of this step, moisture is removed from the atmosphere enclosing the wafer and the wafer is spin dried to assure removal of virtually all liquid so that water spots will not be left on the wafer surface.

Subsequently, the wafer may be raised further and subjected to infrared drying to remove all adsorbed liquid.

One suitable embodiment of a nozzle 245 is shown in FIG. 16. Water is conveyed under pressure through a passage 247 which ends in a mist spray outlet 248. Adjacent outlet 248, there is provided an ultrasonic transducer 249 which imparts the desired ultrasonic vibrations to the resulting mist. Such vibrations can also be created by a transducer having a different orientation or disposed exterior to nozzles 245, or by including such vibrations in the propulsion forces employed to deliver water to the nozzles.

Referring now to wet stripping unit 40, the chemical solutions contained in the tanks of this unit will be of the type normally employed for wet stripping operations. Since the time required for performing a dry stripping operation in unit 24, particularly in accordance with certain features of the invention to be described below, can be shorter than that required by the chemical treatment associated with a wet stripping procedure, the number of tanks containing the wet stripping solution can be doubled to increase the throughput of the installation. This is one reason why unit 40 preferably contains two or more tanks.

These tanks may contain a solution of $H_2SO_4$ and $H_2O_2$, although other chemicals can be employed and the number of tanks containing each chemical can be varied, as needed.

As noted above, a wafer becomes progressively cleaner as it progresses through the installation, which means that the chemical in the downstream tank of unit 40 will be cleaner than that in the upstream tank. Therefore, to increase the utilization of chemical, while maintaining the desired degree of cleanliness in each bath, chemical solution can be transferred periodically between tanks in the upstream direction, before being filtered. In further accordance with the invention, a portion of the solution is drained after having been used in the upstream tank of unit 40, rather than passing through the associated filter, in order to avoid clogging of the filter. The drained portion of the solution is disposed of and replaced with a fresh solution, which is introduced first into the downstream tank.

Solution is removed from unit 40 by the action of one or more pumps. In view of the temperatures employed in a wet stripping operation, the temperature of the solution leaving unit 40, if delivered directly to a pump, would have the effect of shortening pump life. Therefore, according to a further feature of the present invention, such solution is cooled prior to reaching the pump. If the solution is composed of two chemicals which, when mixed, produce an exothermic reaction, this reaction will help to establish the desired process temperature at the time that fresh chemical is introduced into unit 40.

Chemicals employed in wet stripping frequently contain two components having markedly different evaporation rates. According to the invention, the desired solution composition is maintained by monitoring not only the quantity of solution drained from unit 40, but also by determining the rate of evaporation of each component and delivering fresh components in the amounts appropriate to establish and maintain the desired component ratio.

Figure 17:
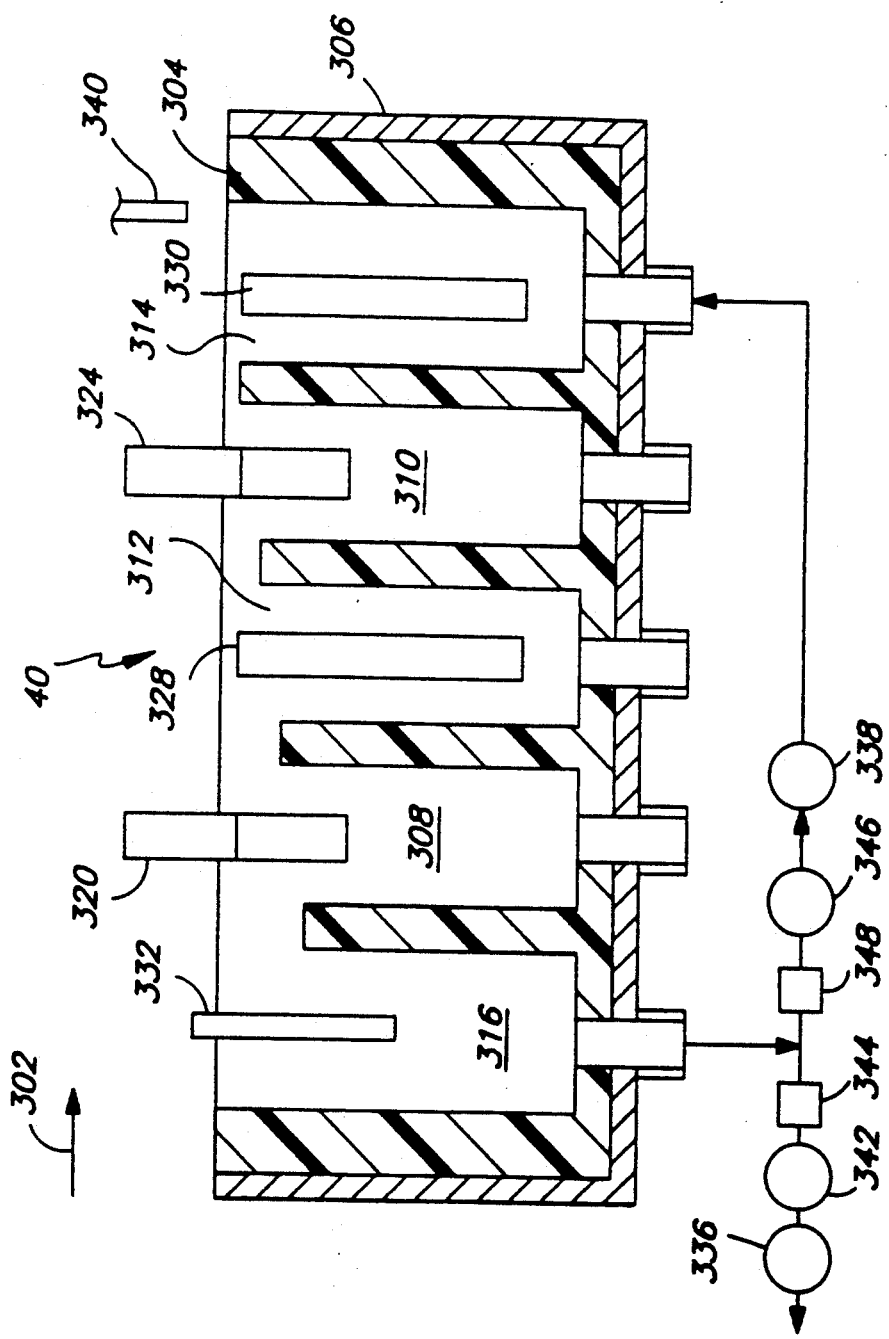
FIG. 17 is an elevational, cross-sectional view of one embodiment of a further unit employed in the system of FIGS. 1 and 2.

The salient details of one embodiment of wet stripping bath tank unit 40 is shown in cross-section in FIG. 17. Arrow 302 represents the general direction of travel of a wafer through wet stripping station 6.

According to a preferred embodiment of the invention, unit 40 presents a plurality of tanks which are formed by suitably shaping a block 304 of plastic, a preferred material being PTFE. Block 304 is encased in a metal shell 306, preferably of stainless steel. Plastic block 304 is bonded to shell 306. Block 304 is shaped to present two stripping tanks 308 and 310, two heating tanks 312 and 314 and an overflow tank 316.

Each of tanks 308 and 310 is associated with a respective robot arm 320, 324 which is provided to lower a wafer into a chemical bath contained in the respective stripping tank. Suitable embodiments of arms 320, 324 have been described above.

Each of tanks 312 and 314 contains a respective heater 328, 330. Tank 316 contains a liquid level sensor 332. In addition, if desired, means may be provided for inducing ultrasonic vibrations in the baths contained in tanks 308 and 310.

The bottom of each tank is provided with a fluid conduit closeable by an associated valve (not shown). The conduit associated with tank 316 is connected to a waste receptacle (not shown) via a flow meter 336 and to the conduit associated with tank 314 via a filter 338. If needed, the line connected to the waste receptacle further contains a pump 342 and a cooler 344 upstream of pump 342. Similarly, the recirculation line contains a pump 346 and a cooler 348.

It will be observed that the walls between adjacent ones of tanks 314-316 decrease in height progressively in the direction opposite to arrow 302. The chemical which is to constitute the stripping baths is introduced into tank 314 via an inlet pipe 340, or two separate inlet pipes, and via the conduit which communicates with the bottom of tank 314. Specifically, fresh chemicals are introduced via pipe 340 while filtered, recycled chemicals are introduced via the conduit in the bottom of tank 314. During a refilling procedure, these chemicals are added to tank 314 until they overflow into tank 310, and then into heating tank 312, stripping tank 308 and, finally, overflow tank 316. During flow through tanks 312 and 314, the chemical is heated by heaters 328 and 330, respectively.

Since a wafer becomes progressively cleaner as it travels through the installation, it is desired that the stripping liquid be employed in downstream tank 310 before it is used in upstream tank 308. The flow direction dictated by the different heights of the tank partition walls assures that this will occur.

During a filling, or refilling operation, chemical is introduced into tank 314 until a defined liquid level is sensed by sensor 332 in tank 316. It is then concluded that all of the tanks have been filled and a stripping operation can proceed.

The stripping chemical should be subjected to periodic decontamination. While this could be achieved by recirculating the solution from tank 316, through filter 338, and back to tank 314, it has been found preferable to withdraw a selected quantity of used chemical from tank 316, via flow meter 336, and to then recirculate a remaining portion of the chemical, via filter 338. This serves, particularly, to prevent or delay clogging of filter 338.

Certain chemical solutions employed for wet stripping consist of mixtures whose ingredients have substantially different rates of evaporation. Because of this, it is difficult to maintain the desired ratio in the bath. An example of such a solution is a mixture of $H_2SO_4$ and $H_2O_2$, which is a preferred solution for stripping resist layers from semiconductor wafers. Specifically, the hydrogen peroxide has a substantially higher evaporation rate than the sulphuric acid; indeed, it can be assumed that the sulphuric acid experiences substantially no evaporation compared to the rate of evaporation of hydrogen peroxide.

This problem is dealt with, according to the present invention, in the following manner. When it is desired to refresh the stripping solution, a certain quantity of solution is withdrawn from the system via flow meter 336, which produces an indication of the quantity which has been withdrawn. Then, after remaining solution has been recirculated via filter 338, quantities of fresh sulphuric acid and hydrogen peroxide, in the desired ratio and in a total amount corresponding to the quantity measured by flow meter 336, are introduced into tank 314 via pipe 340, or via separate pipes. In general, after this has been done, level sensor 332 will indicate that the liquid in tank 316 is not at the desired level. Accordingly, hydrogen peroxide is then introduced, either via pipe 340 or a separate pipe adjacent thereto, until the liquid in tank 316 reaches the desired level, as indicated by level sensor 332. On the assumption that the difference between the quantity of liquid withdrawn through flow meter 336 and the quantity of liquid required to achieve the desired liquid level in tank 316 is due to the evaporation of hydrogen peroxide, this procedure will serve to reestablish the desired ingredient proportions in the stripping bath.

By measurement of the quantity of liquid withdrawn through flow meter 336 and the quantity of hydrogen peroxide introduced to restore the desired level in tank 316, it is possible to keep track of the quantity of each ingredient which has been lost either by drainage or by evaporation and to subsequently adjust the proportions of fresh ingredients introduced to unit 40 to maintain the desired ingredient ratio in the chemical stripping unit.

Figure 18:
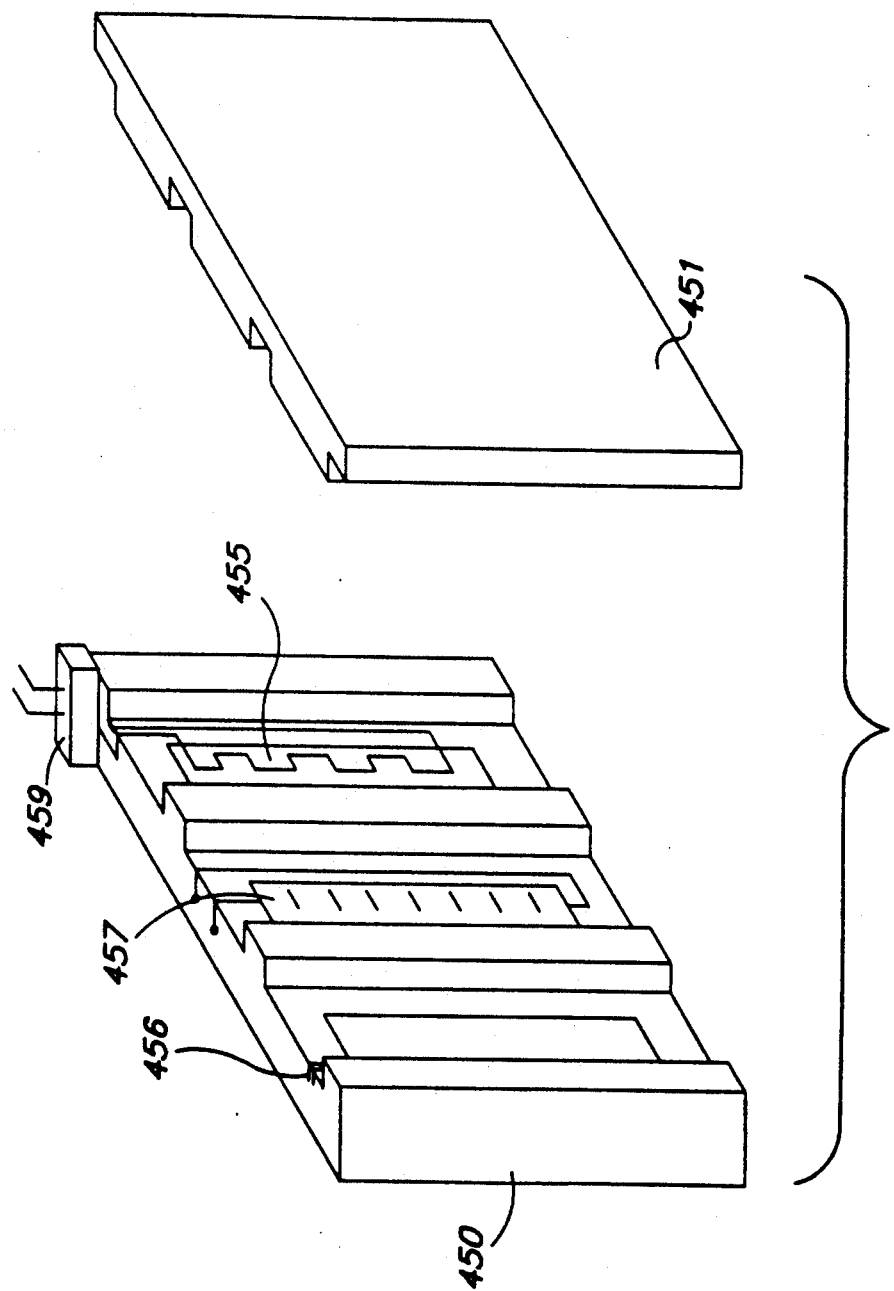
FIG. 18 is an exploded perspective view of a device employed in the unit shown in FIG. 17.

As indicated above, the various liquid baths are to be heated and it is desired that each wafer be exposed to ultrasonic vibrations at least while immersed in the stripping baths. According to a further aspect of the present invention, an integral unit may be provided to both heat the bath liquid and produce the desired ultrasonic vibrations. One embodiment of such a device is shown in FIG. 18 and includes two plastic blocks 450 and 451 which, in the completed device, are brought into contact with one another and bonded together to seal the region of their interface. This region is provided with, for example, two resistive heating units 455 and 456 and an ultrasonic acoustic wave generator 457. Electrical connections for each of these elements can brought out of the unit via respective connector blocks, the connector block 459 for heating element 455 being illustrated.

In further accordance with the invention, the transmission of ultrasonic vibrations to a wafer immersed in one of the stripping chemical baths can be enhanced by removing the walls between tanks 308 and 312 and tanks 310 and 314, resulting in the creation of substantially larger stripping tanks. This alternative can be employed if the heating capacity of units 328 and 330 is sufficient to heat incoming chemical solution sufficiently rapidly to maintain the desired operating temperature in each stripping bath.

The structure illustrated in FIG. 17 can lead to avoidance of buckling of the outer walls of unit 40. Specifically, the thermal stresses induced in a plastic such as PTFE can offset those induced in a metal such as stainless steel. By giving these materials appropriate thicknesses at least at the outer walls of unit 40, a complete thermal stress offset can be attained.

The apparatus according to the present invention makes possible significant improvements in a stripping operation and, in particular, permits "smart" stripping processes to be implemented. For example, according to the invention, an improved stripping operation is performed by carrying out the dry stripping procedure in such a manner as to remove only a portion of the resist layer. It has been found that if the entire resist layer is removed in the dry stripping operation, a certain amount of resist is caused to diffuse into the wafer surface, where it remains as a contaminant which is difficult to remove. Thus, according to the invention, the dry stripping operation is monitored, for example by monitoring the oxygen content of gas flowing out of dry stripper unit 24 and terminating the dry stripping operation when, for example, approximately half of the resist layer has been removed. It is known that the oxygen content of such gas varies in proportion to the remaining thickness of the resist layer. At the start of the stripping operation, the oxygen content has a first known value and at the end of the stripping operation it has a second known value which is lower than the first. The oxygen content value decreases approximately in linear proportion to the thickness of the remaining stripping layer. Thus, by monitoring the oxygen content and producing an indication when it has reached a level midway between the upper and lower values, it is possible to halt the dry stripping operation before the entire resist layer has been removed. Then, the duration of the wet stripping procedure is adjusted to assure complete removal of the remainder of the resist layer.

According to a further aspect of this feature of the invention, monitoring of the oxygen content can be employed to provide an indication of the presence of a resist layer which is difficult to remove with the existing gas composition in stripper unit 24. If the monitoring result indicates that the layer is not being removed at a desired rate, the gas present in dry stripper unit 24 can be changed to one which produces a more effective stripping operation. However, if wafers are being processed at a fixed rate, this will mean that less time remains for the dry stripping operation. In this event, the monitoring result is used by transfer control 60 (FIG. 1) to lengthen the treatment time in wet stripping unit 6.

In accordance with a further feature of the invention, the final rinsing operation, as performed in tank 46, is monitored to assure that the wafer has been completely cleaned. This is done by establishing a flow of rinsing water through tank 46 and monitoring the water exiting the tank for resistivity and total organic content. Both of these parameters vary with the degree of residual contamination of the wafer and the values thereof which correspond to a completely decontaminated wafer are known. Thus, by monitoring these parameters, the rinsing operation can be continued until it is assured that virtually all contaminants have been eliminated. Specifically, as cleaning of the wafer progresses, the resistivity of the water increases and its total organic contant decreases.

By contacting each wafer only at its edges, particularly during the wet stripping and rinsing procedures, it is assured that virtually the entirety of both major surface of the wafer will be uniformly treated.

The concepts of the present invention can be extended to removal of semiconductor layers of other materials. For example, metal nitride layers can be removed using an aqueous solution of phosphoric acid, layers composed of a positive resist, a nitride, metals such as aluminum, titanium and palladium, and polysilicon coatings can be removed using organic chemicals, or oxide layers can be removed using a buffered hydrofluoric acid solution.

The system illustrated in FIGS. 1 and 2 could be expanded to permit performance of processes involving a wet-dry-wet treatment sequence or a dry-dry-wet sequence, or a dry-wet-dry sequence, etc. For example, if it is found that a resist layer which is to be stripped is experiencing a residual reaction from a previous process step, such as the oxidation of a metal layer under the resist coating, a preliminary wet process can be performed to terminate the residual reaction.

If the wafer includes trenches which contain submicron or organic particles, a laser beam can be controlled so as to trace the trenches in order to remove such particles subsequent to the wet stripping operation. This is an example of a dry-wet-dry sequence in accordance with the invention.

According to another possibility, the invention could be implemented to perform a process consisting of a wet-dry sequence. In this case, the wet process would be employed to clean contaminants, while the dry process would be carried out to complete cleaning of the wafer surface.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A system for removing a discrete layer of a defined material from each of a plurality of semiconductor wafers, comprising:
    a) a first removal unit having an entrance region and an exit region, said first removal unit being composed of:
        i) a first material removal device for receiving one wafer at a time and removing at least part of the discrete layer from the wafer by a dry process;
    b) a second removal unit having an entrance region and an exit region, said second removal unit including a second material removal device composed of:
        i) at least one material removal tank;
        ii) first supply means for maintaining in said material removal tank a bath of a liquid solution of a chemical for removing the defined material from each wafer;
        iii) at least one rinsing tank;
        iv) second supply means for maintaining a bath of a liquid rinsing solution in said rinsing tank;
        v) wafer cleaning means for removing contaminants from a wafer; and
        vi) wafer drying means for removing substantially all moisture from a wafer; and
    c) automated transfer means for transferring one wafer at a time, in the recited order:
        from the entrance region, through the material removal device and to the exit region of one of said first second removal units; and from the entrance region, through the material removal device and to the exit region of the other one of said first and second removal units, said automated transfer means further comprising means associated with said second removal unit for transferring one wafer at a time from said entrance region of said second removal unit and then, in the recited order: into said material removal tank; into said rinsing tank; into said wafer drying means; and to said exit region of said second removal unit; and said means associated with said second removal unit for transferring one wafer at a time comprise wafer holding means for holding a wafer in a vertical orientation in said material removal tank and in said rinsing tank; and
    d) wherein said units are arranged so that said exit region of said one of said units is disposed adjacent said entrance region of said other one of said units.

2. A system as defined in claim 1 further comprising a cassette receiving device disposed at said exit region of said other one of said units for receiving an empty cassette, and wherein said automated transfer means are further operative for transferring one wafer at a time at said exit region of said other one of said units into the cassette at said cassette receiving device.

3. A system as defined in claim 2 wherein said one of said units is said first unit and said other one of said units is said second unit.

4. A system as defined in claim 3 wherein said first unit further comprises a second cassette receiving device disposed at said entrance region of said first unit for receiving a cassette containing a plurality of the semiconductor wafers which each have a discrete layer of the defined material.

5. A system as defined in claim 4 wherein the defined material is a resist which is to be stripped from each wafer.

6. A system as defined in claim 5 further comprising process control means for monitoring the stripping of a resist layer from a wafer in said first material removal device and for terminating operation of said first material removal device before the resist layer has been completely removed from the wafer.

7. A system as defined in claim 6 wherein said process control means terminate operation of said first material removal device when approximately one-half of the resist layer has been removal from the wafer.

8. A system as defined in claim 7 wherein said first material removal device operates to pass a stream of gas across the wafer and out of the device and said process control means monitor the stripping of the resist layer by monitoring the oxygen content of the gas leaving the device.

9. A system as defined in claim 8 wherein said wafer handling members include two wafer immersion members each associated with a respective tank and moveable for lowering one wafer at a time into the bath in the respective tank.

10. A system as defined in claim 1 wherein each semiconductor wafer has a peripheral edge and said automated transfer means comprise wafer handling members for supporting each wafer substantially only via the peripheral edge thereof.

11. A system as defined in claim 1 wherein said second material removal device comprises first and second material removal tanks disposed so that each wafer is transferred into said first tank and then into said second tank, and said tanks are constructed to promote flow of the liquid chemical solution from said second tank to said first tank.

12. A system as defined in claim 11 wherein said second material removal device comprises: a unitary plastic member defining said first and second tanks, an overflow tank and partition walls located between said tanks for permitting the liquid chemical solution to flow from said second tank to said first tank and from said first tank to said overflow tank; and a liquid level sensor in said overflow tank.

13. A system as defined in claim 12 wherein said second material removal device further comprises a metal shell surrounding and bonded to said plastic member, said plastic member and said metal shell being of materials such that the stress induced in said metal shell by temperature variations is offset by that induced in said plastic member to prevent buckling of said material removal and overflow tanks.

14. A system as defined in claim 13 wherein said plastic member is made of PTFE and said metal shell is made of stainless steel.

15. A system as defined in claim 12 wherein said second material removal device further comprises conduit means for circulating liquid chemical solution from said overflow tank to said second material removal tank, said conduit means comprising a pump for pumping the solution, a filter for filtering the solution, and means for cooling the solution before it enters said pump.

16. A system as defined in claim 12 wherein said second material removal device further comprises means including a flow meter for withdrawing a measured quantity of liquid chemical solution from said second material removal device.

17. A system as defined in claim 1 wherein said wafer cleaning means comprise: means for supplying an aqueous mist to the wafer; and means for inducing ultrasonic frequency vibrations in the mist.

18. A system as defined in claim 1 wherein: said wafer holding means comprise a plurality of wafer holding devices each associated with only a respective one of said tanks for immersing a wafer in the bath in the respective tank; and said means associated with said second removal unit for transferring one wafer at a time further comprise a wafer transfer assembly for transferring a wafer to and from that one of said wafer holding device which is associated with said material removal tank.

19. A system as defined in claim 18 wherein said wafer transfer assembly comprises first wafer engaging elements and second wafer engaging elements separated from said first wafer engaging elements, and said automatic transfer means comprise control means for transferring a wafer from said first wafer engaging elements to that one of said wafer holding devices which is associated with said material removal tank prior to transfer of the wafer into said material removal tank and for transferring the wafer from that one of said wafer holding devices which is associated with said material removal tank to said second wafer engaging elements after transfer of the wafer into said material removal tank.

* * * * *